US008225268B2

(12) United States Patent
Nakano

(10) Patent No.: US 8,225,268 B2
(45) Date of Patent: Jul. 17, 2012

(54) WIRING DESIGN METHOD FOR WIRING BOARD

(75) Inventor: Mikio Nakano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 383 days.

(21) Appl. No.: 12/563,525

(22) Filed: Sep. 21, 2009

(65) Prior Publication Data

US 2010/0218151 A1    Aug. 26, 2010

(30) Foreign Application Priority Data

Feb. 26, 2009   (JP) .................................. 2009-44319

(51) Int. Cl.
    *G06F 17/50*    (2006.01)
(52) U.S. Cl. ........ 716/137; 716/110; 716/111; 716/112; 716/136; 716/139; 438/111; 29/739; 29/740; 29/741; 29/747; 29/748; 29/749
(58) Field of Classification Search .......... 716/110–112, 716/136–137, 139; 438/111; 29/739–741, 29/747–749
    See application file for complete search history.

(56) References Cited

U.S. PATENT DOCUMENTS

| 7,271,495 B2 * | 9/2007 | Prengel et al. ................. 257/778 |
| 7,272,806 B2 * | 9/2007 | Frank et al. .................... 716/112 |
| 7,412,683 B2 * | 8/2008 | Mimura et al. ................ 716/137 |
| 2004/0163056 A1 * | 8/2004 | Frank et al. ....................... 716/5 |

FOREIGN PATENT DOCUMENTS

JP    2007-287023 A    11/2007

OTHER PUBLICATIONS

Y. Tomioka et al., "Routability Driven Modification Method of Monotonic Via Assignment for 2-layer Ball Grid Array Packages." Proceedings of ASP-DAC, pp. 238-243, 2008.

* cited by examiner

*Primary Examiner* — Nghia Doan
(74) *Attorney, Agent, or Firm* — Knobbe Martens Olson & Bear LLP

(57) ABSTRACT

A wiring design method for a wiring board comprises, if design rule errors are found in the wiring design, selecting one of the design rule errors as a selected design rule error, specifying a predetermined number of the second connection terminals as selected second connection terminals that correspond to the selected design rule error, and moving the selected second connection terminals to predetermined coordinate positions. Each time when the selected second connection terminals are moved to the post-movement coordinate positions, the method comprises connecting the second connection terminals and the first connection terminals, conducting the design rule check, and determining whether no design rule errors are detected newly and the selected design rule error is not detected either.

19 Claims, 12 Drawing Sheets

WIRING DESIGN METHOD FOR WIRING BOARD

CROSS REFERENCE TO RELATED APPLICATIONS

This application is based upon and claims the benefit of priority from the prior Japanese Patent Application No. 2009-44319, filed on Feb. 26, 2009, the entire contents of which are incorporated herein by reference.

BACKGROUND OF THE INVENTION

1. Field of the Invention

The present invention relates to a method for wiring design for a variety of wiring boards such as a wiring board of semiconductor device packages and a printed circuit board (PCB) of electric apparatuses.

2. Background Art

A variety of wiring boards each of which has a plurality of wiring surfaces are available such as a semiconductor package wiring board and a PCB for various electric apparatuses.

For these wiring boards, the wiring design is desired to be of a high integration and a high accuracy. This desire may be accompanied by a tendency of taking a longer time to design the wiring.

Accordingly, to shorten the design time, in the past, a method was employed for automatically designing the wiring by using an automatic wiring design apparatus. This shortens the wiring design time than the method of a designer designing the entire wiring manually. However, as described later, such an automatic wiring method by use of the automatic wiring design apparatus may give rise to a design error referred to as a design rule error in some cases. In such a case, it is difficult to work out a design in such a manner as to eliminate design rule errors by using the automatic wiring design apparatus. Thus, the designer worked out a design to eliminate design rule errors manually. However, wiring, if it is of a high integration, has taken a prolonged time for manual design by the designer, thus resulting in a long time to design completely.

A method for automatically eliminating the design rule errors is disclosed in Japanese Patent Laid-Open No. 2007-287023.

SUMMARY OF THE INVENTION

According to an aspect of embodiments of the present invention, there is provided a wiring design method for a wiring board, the wiring board comprising first connection terminals and second connection terminals formed on a first surface of the wiring board, the first connection terminals and the second connection terminals being correlated with each other one-to-one, the method comprising: connecting the first connection terminals and the second connection terminals, respectively, on the first surface; and conducting design rule check; if at least one design rule error is found in an obtained result of the design rule check, selecting one design rule error from the obtained result of the design rule check as a selected design rule error; specifying a predetermined number of the second connection terminals as selected second connection terminals that correspond to the selected design rule error; moving the selected second connection terminals to predetermined coordinate positions on the first surface, respectively, to form several connecting patterns; and for each of connecting patterns, connecting the second connection terminals including the selected second connection terminals and the first connection terminals correlated with the second connection terminals including the selected second connection terminals, respectively, on the first surface; conducting design rule check; and determining whether neither design rule errors are detected newly nor the selected design rule error is detected.

DETAILED DESCRIPTION OF THE INVENTION

Hereafter, before describing embodiments of the present invention, a description will be given of the background to developments of the present invention by the present inventor.

First, the present inventor analyzed his own wiring design method performed in the past.

The method for designing wiring on a wiring board will be described simply. As an example, it will be described as a method for wiring design on a wiring board of ball grid array (BGA) packages. It is to be noted that in the present invention, the wiring boards to be designed are not limited to the wiring boards for the semiconductor packages.

Figure 8:
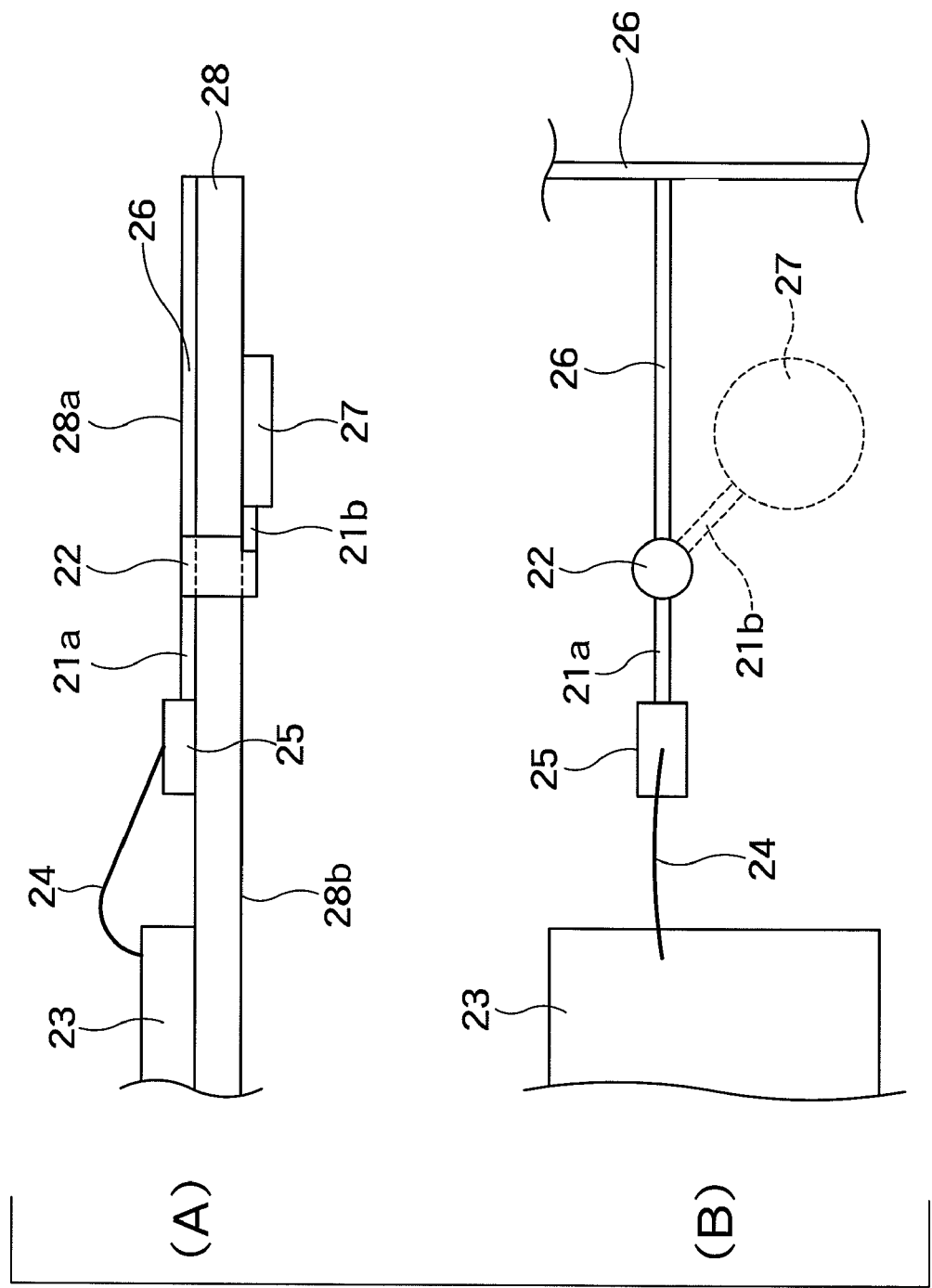
FIGS. 8A and 8B are partial structure diagrams of a BGA package.

First, the structure of the BGA packages will be described simply. FIGS. 8A and 8B show a part of the BGA package. FIG. 8A is its partial side view and FIG. 8B is its partial plan view. The BGA package comprises a wiring board 28 having two wiring surfaces (first surface 28a and second surface 28b) that face each other. The first surface 28a includes on it a semiconductor chip 23 having connection terminals, bonding fingers (semiconductor chip connection terminals) 25 which are connected through wires 24 with the connection terminals formed on the semiconductor chip 23, and connections 21a which are connected with the bonding fingers 25 electrically. The second surface 28b includes on it ball pads 27 on which solder balls (external device connection terminals) to be directly connected with an external device outside the BGA package are mounted respectively and connections 21b which are connected with the ball pads 27 electrically. Further, the wiring board 28 have vias 22 which are formed from the first surface 28a through the second surface 28b of the wiring board 28 in order to connect the connections 21a disposed on the first surface 28a and the connections 21b disposed on the second surface 28b.

Next, a wiring design method by use of an automatic wiring design apparatus will be described for designing, in particular, a wiring design method for the connections 21a on the first surface 28a of such a BGA package wiring board 28, with reference to FIGS. 9 and 10. The following automatic wiring design apparatus and the wiring design method by use of it are one example.

Figure 9:
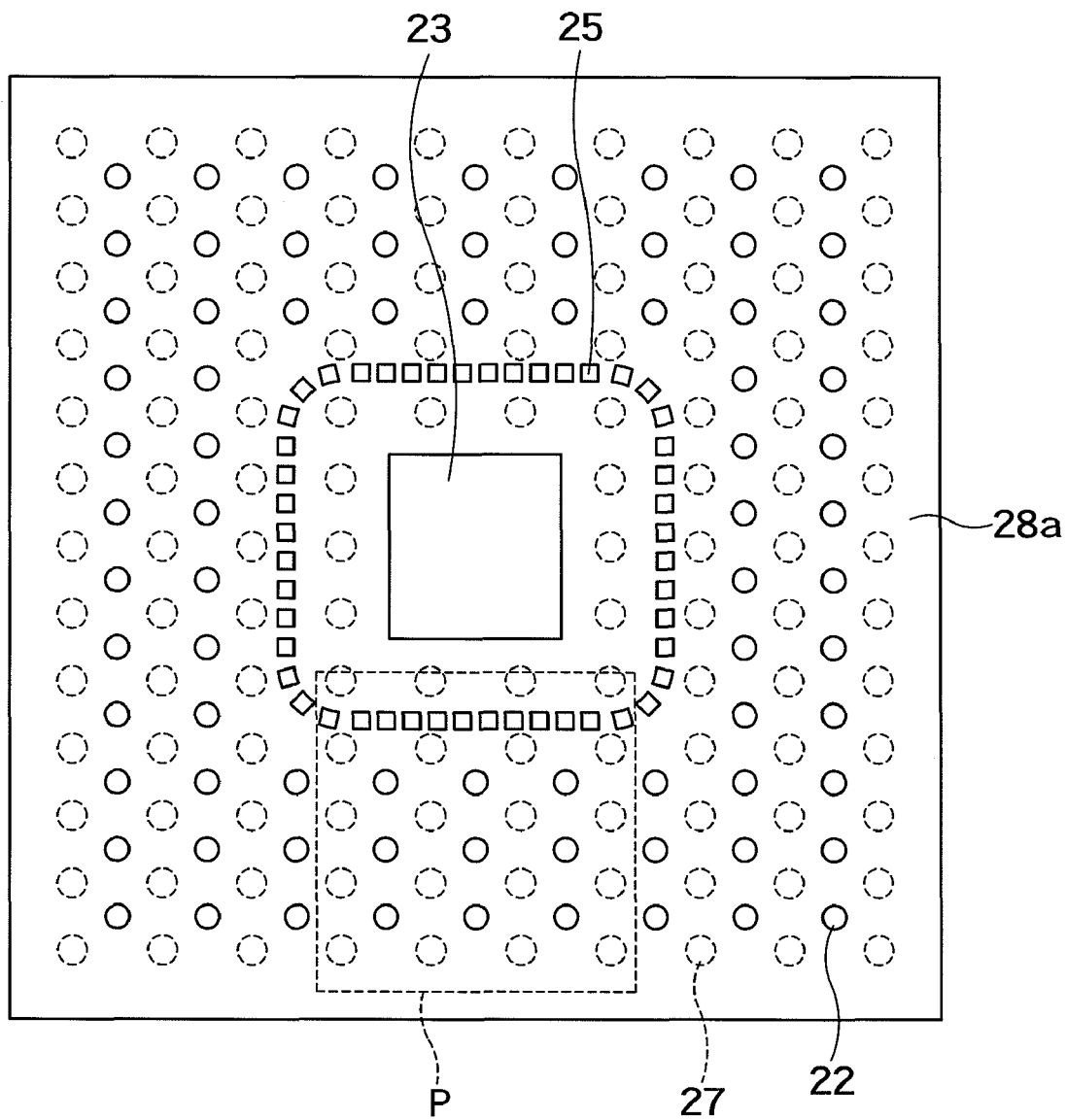
FIG. 9 is an entire drawing for explaining one example of the wiring design method for a wiring board.

FIG. 9 is an outlined drawing of the first surface 28a. In it, only the via 22, the bonding finger 25, the semiconductor chip 23, and the ball pad 27 are shown, and the wiring 21a and the wire 24 are omitted. Part P of such a first surface 28a as shown in FIG. 9 is shows in FIG. 10 in more detail in order to describe the method for designing the connection 21a.

As the first step, before designing the connections, the following preparation will be performed.

Figure 10:
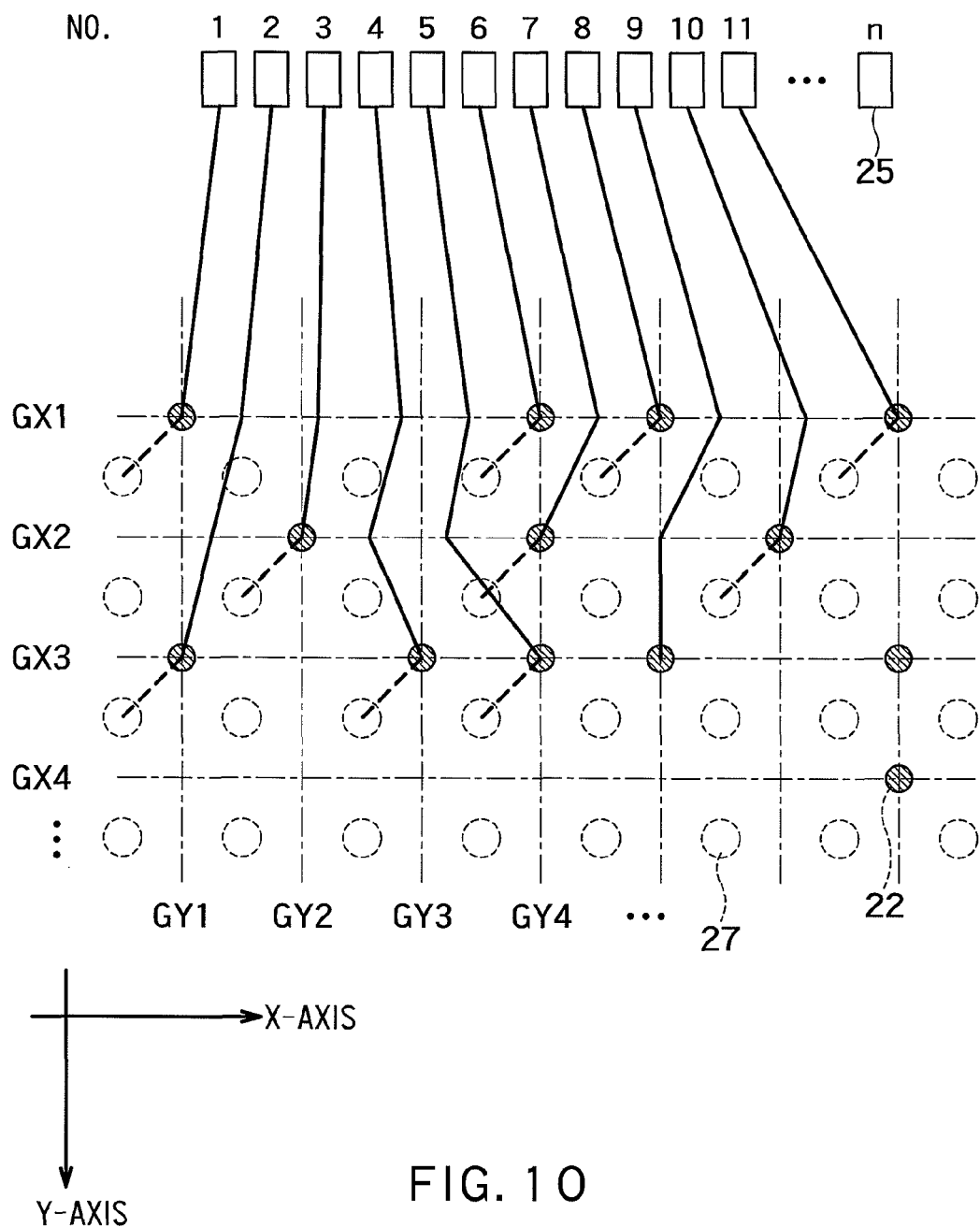
FIG. 10 is a partial drawing for explaining the one example of the wiring design method for the wiring board.

As shown in FIG. 10, the bonding fingers 25 are each assigned numbers beforehand. Specifically, the bonding fingers 25 are numbered in accordance with an arrangement thereof. (For example, as shown in FIG. 10, if one of the bonding fingers 25 is assigned number 1, its right-hand neighbor bonding finger 25 on the paper is assigned number 2.) These numbers are appellations to specify the bonding fingers 25 and used to give the relationship of connections among the bonding fingers 25, the connections 21, the vias 22, and the ball pads 27, so that based on those numbers, a central processing unit of the automatic wiring design apparatus may perform processing to define wiring paths of the wiring connections 21a.

Next, the ball pads 27 to be connected to the corresponding bonding fingers 25 are defined. Specifically, to define the relationship for the final connections between the bonding fingers 25 and the corresponding ball pads 27, the numbers of the ball fingers 25 are assigned similarly to the corresponding ball pads 27, respectively. It is to be noted that the connections between the respective bonding fingers 25 and the corresponding ball pads 27 are predetermined in accordance with how the connection terminals of the semiconductor chip 23 are connected with the external device outside the BGA package. (However, the connection relationship between the bonding fingers 25 and the corresponding ball pads 27 is limited in order that the connections 21a may not cross each other. The limitation may be, for example, such that the larger the values of the numbers assigned to the ball pads 27 are, the more rightward they are disposed on the paper of FIG. 10.)

Next, on the first surface 28a, virtual XY coordinate axes are given. The X coordinate axis is parallel to the line of the bonding fingers 25. The Y coordinate axis crosses the X coordinate axis perpendicularly. More specifically, the orientations of these coordinate axes of X and Y are assumed to be, for example, from the left to the right and from the top to the bottom on the paper respectively.

Further, a virtual grid is created for the central processing unit of the automatic wiring design apparatus to perform arithmetic processing. For example, as shown in FIG. 10, on the second surface 28b, the ball pads 27 are disposed regularly (this arrangement is predetermined by the shape of the semiconductor package). Accordingly, the virtual grid has the same inter-grid line spacing as that between the ball pads 27 disposed regularly (the spacing is larger than the diameter of each of the vias 22), which grid lines are supposed to be divided into two orientation groups that intersect with each other perpendicularly. The grid lines are disposed so that their intersections may not overlap with the ball pads 27. Of these grid lines thus disposed, those parallel with the row of the bonding fingers 25, in other words, the grid lines parallel with the X coordinate axis are assumed to be line GXn (n: natural number). Also, the grid lines that intersect with line GXn perpendicularly are assumed to be line GYn (n: natural number). Further, these lines GXn are numbered sequentially. The numbers are assumed to be assigned in an ascending order from line GXn that is disposed closest to the row of the bonding fingers 25. That is, the grid lines will be GX1, GX2, GX3, . . . and GXn starting from that closest to the row of the bonding fingers 25.

As the second step, the designer supplies the following input data to an input unit of the automatic wiring design apparatus:

the numbers and position coordinates of the bonding fingers 25; and the numbers and coordinate positions of the ball pads 27.

Of these input data, the position coordinates of the bonding fingers 25 and those of the ball pads 27 are predetermined by the shape of the semiconductor package and the size of the semiconductor chip 23 mounted on the first surface 28a.

As the third step, the designer supplies rough position coordinates of the vias 22 to the input unit of the automatic wiring design apparatus.

This operation is detailed as follows.

A positional relationship between the ball pads 27 and the corresponding vias 22 for connection is presumed. For example, each of the vias 22 corresponding to each of the ball pad 27 is presumed to be present at the intersection between the upper right grid lines nearest the ball pad 27. Based on such a presumption, the vias 22 are disposed on the wiring board 28.

In order to make clear the connection relationship between the ball pads 27 and the corresponding vias to be connected to each of the ball pads 27, the numbers of the ball pads 27 are assigned similarly to the corresponding to the vias 22 respectively.

The numbers of the vias 22 and their position coordinates are supplied to the input unit as input data.

In order to define a connection relationship between the bonding fingers 25 and the connections 21a to be connected therewith electrically, the numbers of the bonding fingers 25 are assigned similarly to the corresponding to connections 21a respectively.

As the fourth step, based on the input data and the limiting condition supplied to the input unit, a wiring module in the central processing unit defines rough positions (topologies) of the connections 21a on the first surface 28a. The topology of each of the connections 21a is designed so that each of the connections 21a may extend from each of the bonding fingers 25 toward each of the vias 22 that corresponds to it one-to-one. That is, as shown in FIG. 10, each connection 21a extends as crossing lines GXn sequentially. Further, the topology of each of the connections 21a is defined based on the limiting condition.

The limiting condition is such that the connections 21a and the vias 22 may not overlap with each other and the connections 21a may not overlap with each other. In other words, the limiting conditions rule them to the effect that the magnitude relation between the numbers assigned to the connections 21a and the vias 22 and that between the coordinates (X coordinates) of the connections 21a on lines GXn and the coordinates (X coordinates) of the vias 22a may be the same as each other. It will be described in more detail as follows.

It is ruled that the larger the number assigned to each connection 21a is, the larger an X coordinate (as described before, in FIG. 10, the X coordinate value increases as it goes to the right on the paper of FIG. 10) at which this connection 21a crosses each line GXn must become. That is, in FIG. 10, the larger the number assigned to each connection 21a is, the more rightward it is disposed on the paper.

It is ruled that when each connection 21a crosses each line GXn, each connection 21a must pass through between the via 22 that is disposed on this line GXn and that is assigned a number which is smaller than and most closest to the number assigned to this connection 21a and the via 22 that is disposed on this line GXn and that is assigned a number which is larger than and most closest to the number assigned to this connection 21a.

For example, under this rule, if via [m−2] and via [m+2] (m: natural number) are disposed on line GXk (k: natural number), connection [m−1], connection[m], and connection [m+1] must cross line GXk between these two vias.

By using such a limiting rule, the topology of the connection 21a is determined that rules which connection 21a must pass through between which vias 22 on which line GXn.

As the fifth step, based on the topology of each connection 21a, its detailed position coordinates are defined in accordance with a predetermined rule. The predetermined rule is a condition, for example, that when a plurality of the connections 21a pass through between the two vias 22 which neighbor each other on the same line GXn, the X coordinate must be defined so as to give the same spacing between one connection 21a and another. Then, the detailed coordinates of the bonding fingers 25 and the connections 21a on lines GXn are defined to define also the wiring path of the connections 21a by linking the vias 22, thus completing wiring design of the connections 21a on the first surface 28a.

It is to be noted that wiring design of the connections 21b on the second surface 28b will be completed by directly connecting predetermined vias and predetermined ball pads 27 to each other.

As the sixth step, design rule check (DRC) is conducted on the thus designed connections 21a and 21b. The design rule check means to check whether wiring is designed in accordance with rules which are referred to as design rules and must be followed by the connections 21a and 21b and the via holes 22. More specifically, check is conducted all over the first surface 28a and the second surface 28b about whether the wiring spacing between the connections 21a and 21b and spacing between each of the connections 21a and 21b and each of the vias 22 are at least predetermined value respectively. (In other words, in contrast to designing of the connections 21a in which attention was paid only to the coordinates on lines GXn, the design rule check covers the connections 21a and the vias 22 all over the first surface 28a.)

Figure 11:
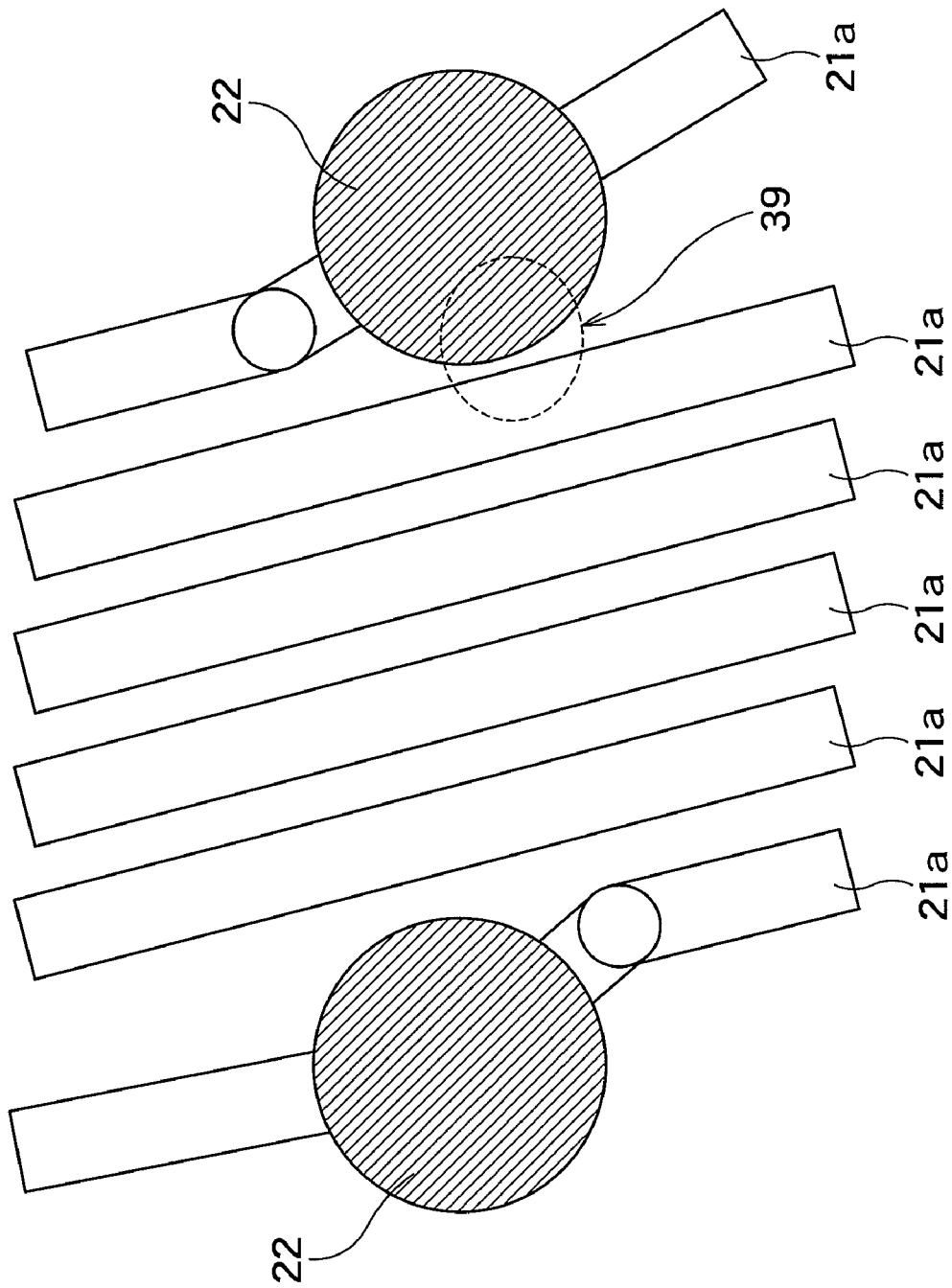
FIG. 11 is a drawing for showing one example of design rule errors.

Then, as shown in FIG. 11, a position (design rule check error: DRC error) 39 where the design rules error presents, if detected, will be displayed.

As the seventh step, if at least one design rule error is detected, the designer manually redesigns wiring in order to eliminate the design rule errors. If the design rule errors are all eliminated by such redesigning, the wiring design is completed.

However, as described before, if the designer eliminates the design rule errors by hand, it will take a long time.

Accordingly, the present inventor tried to work out a wiring design method that designs wiring taking into account the design rules from the beginning in order to avoid the occurrence of a design rule error from the start.

Figure 12:
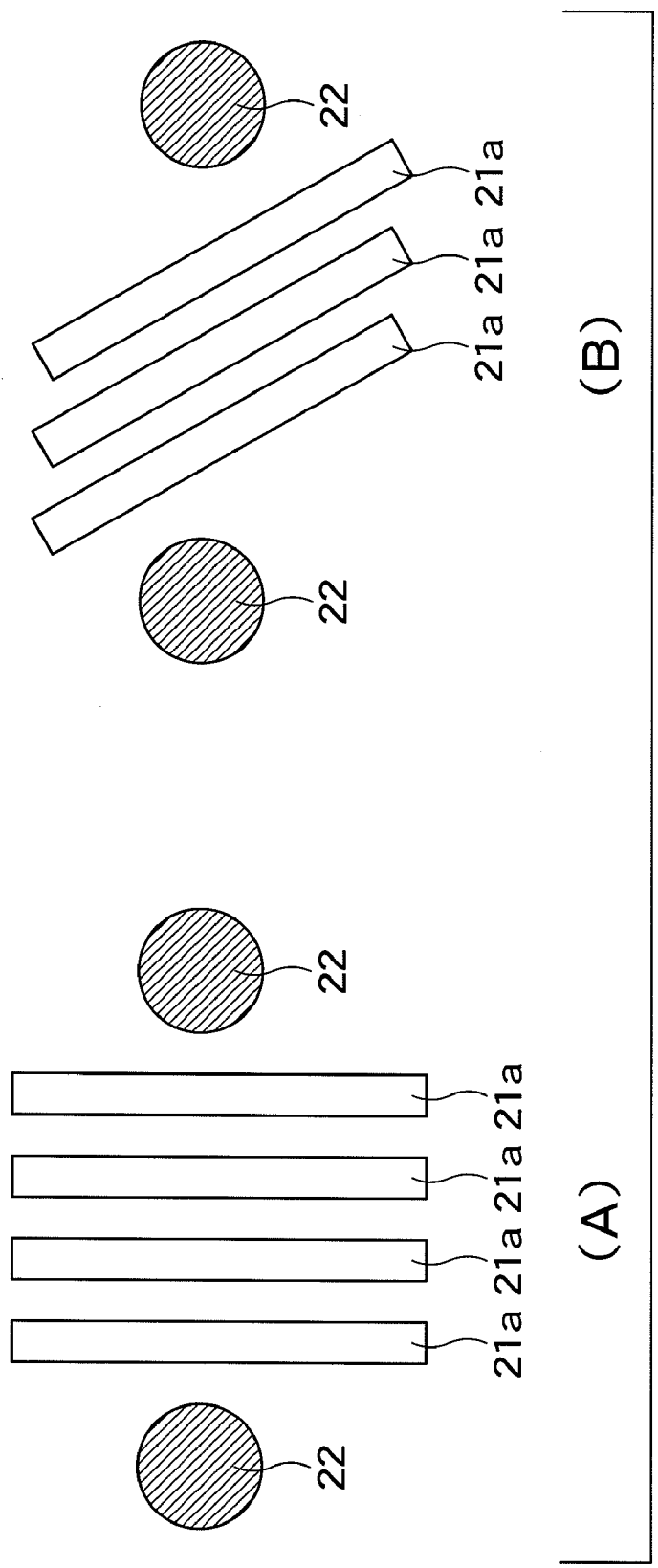
FIGS. 12A and 12B are drawings for explaining a reason for a difference in number of wire connections passing between neighboring vias which is caused by a connecting angle.

First, the present inventor tried to incorporate design rules into a wiring design method as one of its limiting conditions. The limiting conditions to represent the design rules may be, for example, as follows. One design rule may be such that the spacing between the connections 21a or between the connection 21a and the via 22 must be at least a predetermined value. If this design rule translated into the limiting conditions which have been used in the automatic wiring design apparatus, the limiting condition is a condition which limits the number of the connections 21a that pass through between the two vias 22 neighboring on the same line GXn. However, this limiting condition is difficult to conduct, that is, it is difficult to previously define the number of the connections 21a that can pass through between the two neighboring vias 22 on the same line GXn. This will be described below with reference to FIGS. 12A and 12B. Generally, the connections 21a on the first surface 28s can be designed at an arbitrary angle. If the spacing between the connections 21a and that between the connection 21a and the via 22 are made constant, the number of the connections 21a that can pass through between the two neighboring vias 22 on the same line GXn is four in FIG. 12A, for example, whereas in FIG. 12B, the number of the connections 21a that can pass through between the two neighboring vias 22 is three. Thus, there occurs a difference in number of the connections 21a that can pass through between the two neighboring vias 22 owing to a difference in angle of the connections 21a despite that the distance between the two neighboring vias 22 is the same. That is, since the connections 21a can be designed at an arbitrary angle, it is difficult to define the number of the connections 21a that can pass through between the two neighboring vias 22. Therefore, it is difficult to make limiting conditions that reflect such design rules into the method for designing wiring of the connections 21a by using the automatic wiring design apparatus.

With these, the present inventor considered it would be difficult to obtain such a wiring design method as not to give rise to design rule errors from the beginning.

Accordingly, taking into account the difficulty in avoiding the occurrence of a design rule error from the beginning, the present inventor tried to work out a method for designing wiring once and then automatically eliminating the design rule errors that occurred. According to such a method, the automatic wiring design apparatus need not be changed so much and, moreover, design rule errors can be eliminated automatically in designing, thus significantly shortening the time it takes to complete wiring design.

In the case of such design to eliminate design rule errors automatically, it is necessary to specify the causes for design rule errors. However, on the high integration wired wiring board, there may be cases where composite factors are mixed in occurrence of design rule errors, so that they cannot easily be specified.

Accordingly, the present inventor tentatively defined that the design rule errors are all caused by the positions of the vias 22. Further, based on this tentative definition, he considered to select vias by utilizing the automatic wiring design apparatus, move them, and design wiring by utilizing the automatic wiring design apparatus again, thus eliminating the design rule errors.

It is to be noted that in the following description, the expression of "specifying a via as that which caused a design rule error" is used to mean "presuming a via as that which caused a design rule error".

Also, the present inventor considered to specify a causal via for selected one design rule error (selected design rule error) by sequentially deleting the vias 22 from the wiring board 28 and, in this condition (in a condition where the vias 22 are deleted), designing the connections 21a and 21b by the automatic wiring design apparatus, and then conducting design rule check to confirm that the selected design rule error is eliminated. Further, the present inventor considered to move the specified causal via for the selected design rule error and then design wiring by using the automatic wiring design apparatus, thus eliminating the selected design rule error.

It is thus possible to use the automatic wiring design apparatus without changing it so much. Further, various types of the automatic wiring design apparatuses can be used.

A description will be given of embodiments of the present invention.

(First Embodiment)

Figure 1:
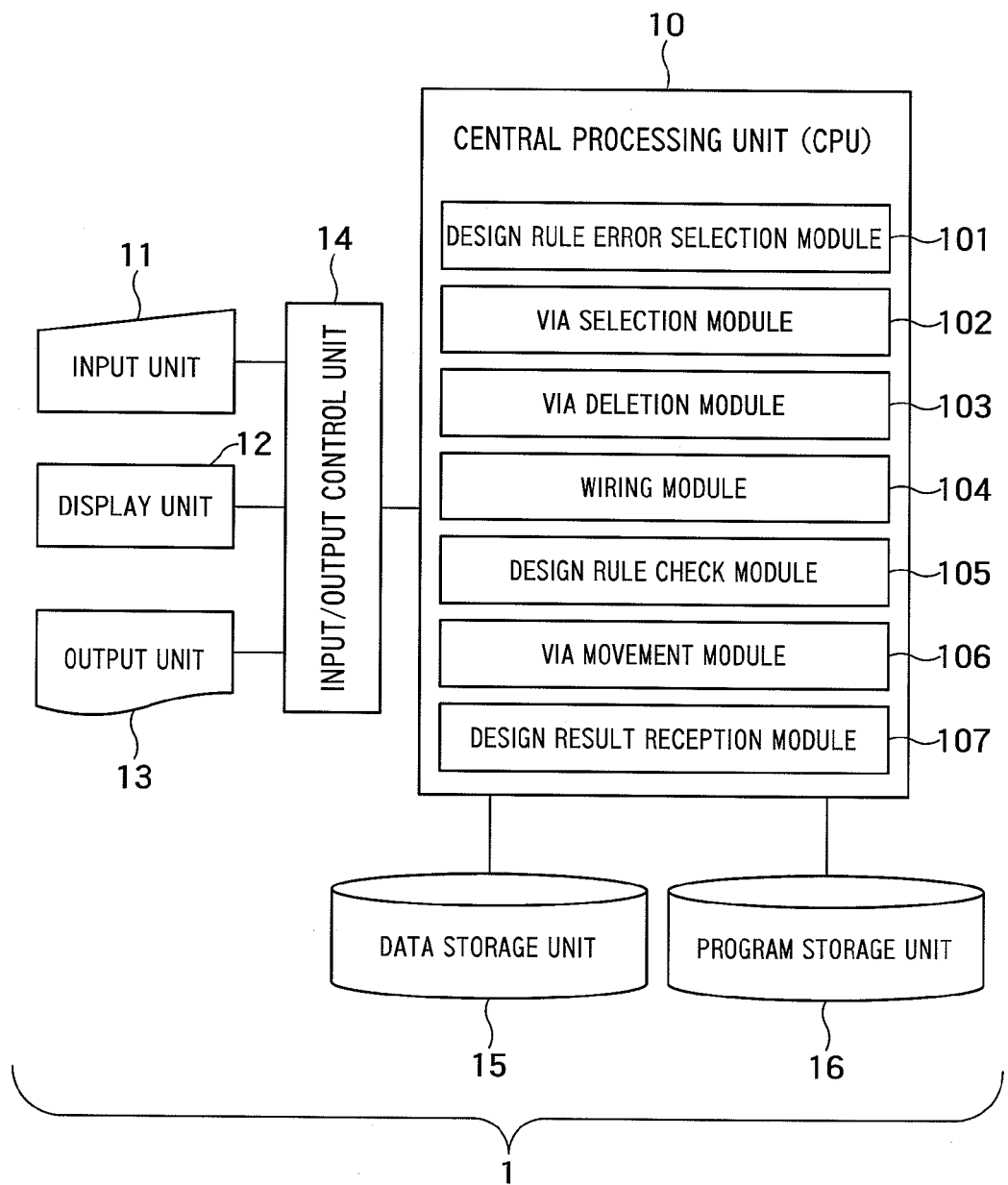
FIG. 1 is a block diagram showing an automatic wiring design apparatus according to embodiments of the present invention.

An automatic design apparatus 1 according to a first embodiment of the present invention comprises an input unit 11 to which input data is supplied, a central processing unit (CPU) 10 which carries out wiring design, a display unit 12 and an output unit 13 which design results are displayed on and provided to, a program storage unit 16 which stores a wiring design program, and a data storage unit 15 which stores various types of data about wiring design, as shown in FIG. 1. The input unit 11, the display unit 12, and the output unit 13 are connected through an input/output control unit 14 to the CPU 10, while the program storage unit 16 and the data storage unit 15 are directly connected to the CPU 10. The CPU 10 comprises a design rule error selection module 101, a via selection module 102, a via deletion module 103, a wiring module 104, a design rule check module 105, a via movement module 106, and a wiring design result reception module 107. These modules will be used by a wiring design method to be described later.

Figure 2:
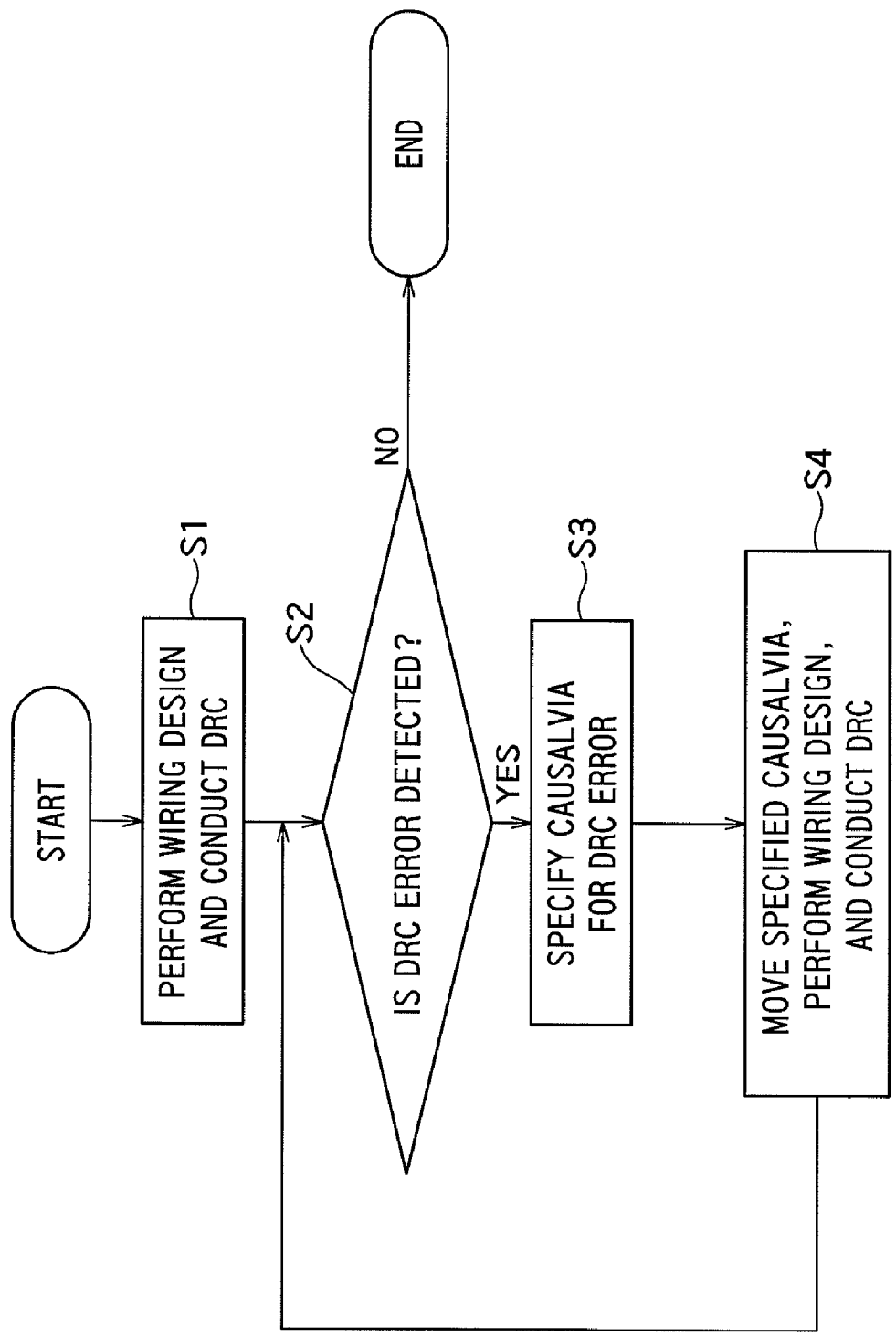
FIG. 2 is an outlined flowchart of a wiring design method according to the embodiments of the present invention.

The wiring design method according to the first embodiment includes the following four major steps. The flow of those four major steps is shown in a flowchart of FIG. 2. These major steps are detailed as follows.

(Step 1) All of necessary vias 22 are disposed on a wiring board tentatively and, in this condition, first wiring design is performed on connections 21a on a first surface 28a by using the wiring module 104. Wiring design of connections 21b on a second surface 21b is performed by directly connecting predetermined vias 22 and predetermined ball pads 27 respectively. Further, design rule check is conducted on the obtained wiring design of the connections 21a and 21b by using the design rule check module 105.

(Step 2) Determination is made as to whether at least one design rule error is detected as a result of conducting design rule check at step 1.

If at least one design rule error is detected, an advance is made to step 3.

On the other hand, no design rule error is detected, a result of the wiring design performed at step 1 is indicated on the display unit 12 as a final wiring design result and also provided to the output unit 13, thus ending wiring design.

(Step 3) One selected design rule error is selected with the design rule error selection module 101 from among the design rule errors detected at step 1, to specify a causal via for the selected design rule error. Step 3 will be described in detail later.

(Step 4) The causal via is moved and, in this condition, wiring design is performed to then conduct design rule check, thus providing such wiring design as to eliminate the selected design rule error. Step 4 will be described in detail later.

Further, according to the first embodiment, after performing this series of four major steps, steps 3 and 4 are repeated in this order until all the design rule errors are eliminated.

As described before, the wiring design method according to the present first embodiment is based on the presumption that the design rule errors are all caused by the vias 22.

Figure 3:
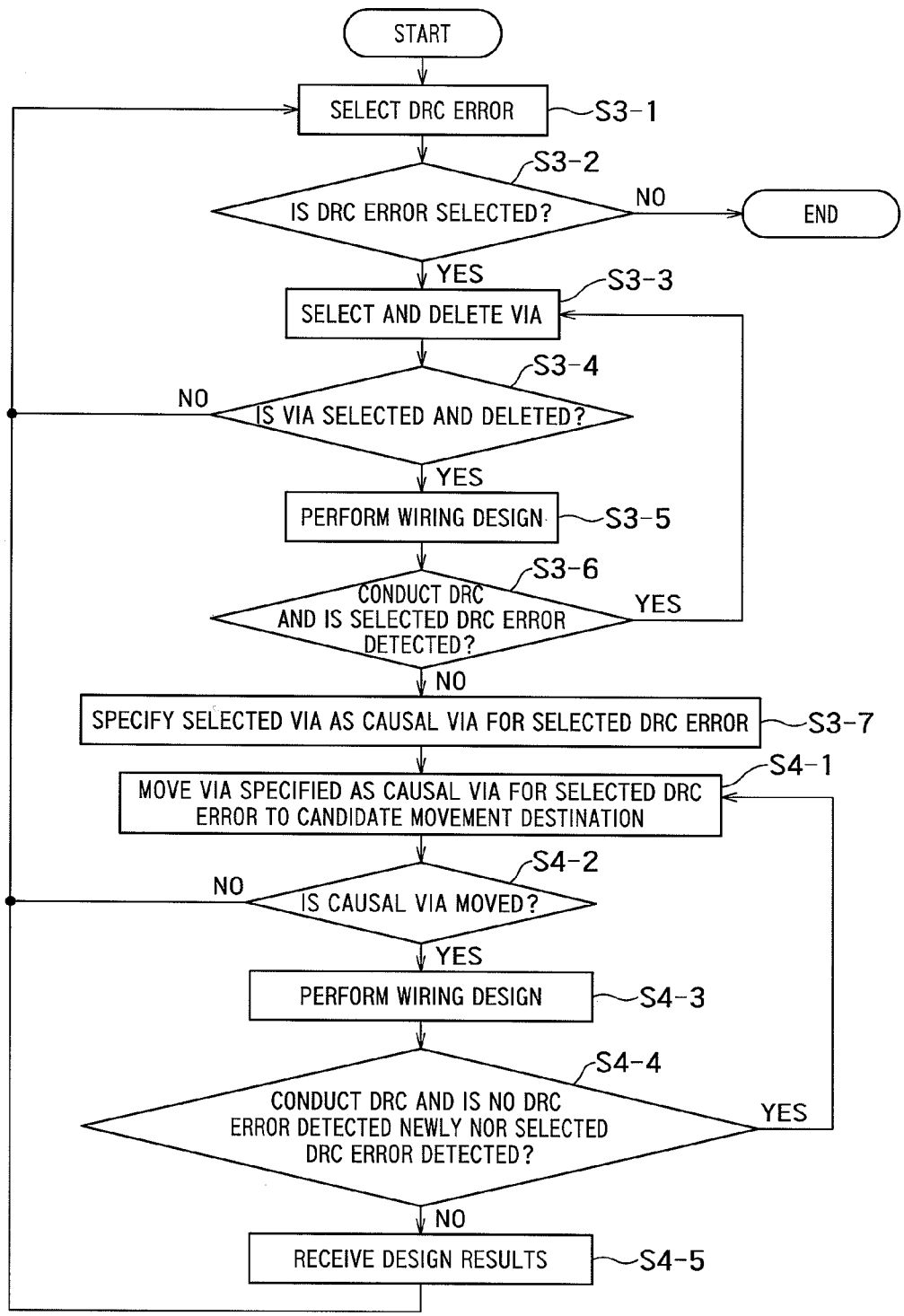
FIG. 3 is a flowchart showing the wiring design method according to a first embodiment.

Steps 3 to 4 in wiring design in the first embodiment are described in detail as follows. A detailed flow of these steps of 3 and 4 is shown as a flowchart in FIG. 3.

(Step 3-1) If a design rule error is detected at step 1, one of the detected design rule errors is selected as a selected design rule error by using the design rule error selection module 101. Next, an advance is made to step 3-2.

(Step 3-2) Determination is made as to whether a selected design rule error is selected at step 3-1.

If the selected design rule error is selected, an advance is made to step 3-3.

On the other hand, no selected design rule error is selected, wiring design ends.

(Step 3-3) One of the vias 22 formed in the wiring board 28 is selected as a selection via by using the via selection module 102. Next, the selection via is deleted using the via deletion module 103. Next, an advance is made to step 3-4.

(Step 3-4) Determination is made as to whether the selection via is selected and deleted.

If the selection via is selected and deleted, an advance is made to step 3-5.

On the other hand, if no selection via is selected or the selection via is yet to be deleted, a return is made to step 3-1.

(Step 3-5) In a condition where the selection via is deleted, wiring design of the connections 21a on the first surface 28a is performed by using the wiring module 104. Wiring design of the connections 21b on the second surface 28b is also performed by using the wiring module 104 in the condition where the selection via is deleted. Next, an advance is made to step 3-6.

(Step 3-6) Design rule check is conducted on the wiring results of the connections 21a and 21b obtained at step 3-5 by using the design rule check module 105.

If the selected design rule error selected at step 3-1 is eliminated (no selected design rule error is detected) as a result of thus conducting design rule check, an advance is made to step 3-7.

On the other hand, if the selected design rule error is yet to be eliminated (a selected design rule error is detected), an advance is made to step 3-3.

Processing from steps 3-3 to 3-6 is repeated until the selected design rule errors are eliminated. That is, the vias 22 in the wiring board 28 are all selected and deleted sequentially and, in this condition, wiring design is performed on the connections 21a and 21b and design rule check is conducted on the thus obtained connections 21a and 21b to determine whether the selected design rule errors are eliminated, repeatedly.

(Step 3-7) The selection via is specified as a causal via for the selected design rule error. An advance is made to step 4-1.

(Step 4-1) The causal via specified at step 3-7 is moved to one of predetermined candidate movement destinations by using the via movement module 106. Next, an advance is made to step 4-2.

The candidate movement destination refers to an empty space on the wiring board 28 (position which does not overlap with the ball pads 27 and at which neither the connections 21a nor the other vias 22 are present) that is distant by a predetermined distance from the current position of the causal via. For example, the candidate movement destinations are presumed to be a plurality of empty spaces which are in a range distant by about one to several cells of the aforesaid virtual grid from it. Further, such a space is divided into grid cells each of which has a predetermined size, which are then numbered and defined as candidate movement destinations. One of these candidate movement destinations can be selected so that the causal via may be moved at its position.

(Step 4-2) Determination is made as to whether the causal via is moved.

If the causal via is moved, an advance is made to step 4-3.

On the other hand, if the causal via is yet to be moved, a return is made to step 3-1.

(Step 4-3) Wiring design of the connections 21a on the first surface 28a is performed by using the wiring module 104. Subsequently, wiring design of the connections 21b on the second surface 28b is performed. Next, an advance is made to step 4-4.

(Step 4-4) Design rule check is conducted using the design rule check module 105 on the connections 21a and 21b on which design was performed at step 4-3.

If the selected design rule error is eliminated and no design rule error is detected newly, an advance is made to step 4-5.

On the other hand, if the selected design rule error is yet to be eliminated and/or a new design rule error is detected, a return is made to step 4-1. Then, processing from steps 4-1 to 4-4 is repeated until the selected design rule error is eliminated and no design rule error is detected newly.

(Step 4-5) The wiring design results obtained at step 4-3 are input into the data storage unit 15 through the design result reception module 107.

Moreover, processing from steps 3-1 to 4-5 is repeated until the design rule errors are all eliminated. Then, the wiring design results at the time when the design rule errors are all eliminated are indicated on the display unit 12 as the final wiring design result and also provided to the output unit 13, thus completing wiring design.

It is to be noted that if any one of the design rule errors is not eliminated even after performing wiring design of the present invention in such a manner, the designer manually designs such wiring as to eliminate all of the design rule errors. If any of the design rule errors are reduced by the present invention even manually by the designer finally, it will relieve him of manual designing to some extent, thus leading to a shortened design time.

(Second Embodiment)

A description will be given of a second embodiment. In the second embodiment, step 2 (step of specifying causal vias) has been improved. At step 2 in the first embodiment, based on the presumption that all of vias 22 on a wiring board 28 are the possible causal via for design rule errors, those vias have been deleted one by one, repeatedly. In contrast, at step 2 in the second embodiment, the possible causal vias 22 for design rule errors are limited beforehand and then deleted one by one, repeatedly. This gives the second embodiment an advantage of shortening the time to specify the causal vias as compared to the first embodiment.

More specifically, in the second embodiment, the possible causal vias 22 for a selected design rule error are previously limited to those that are presumed to be present in a range distant by a predetermined distance from the position of the selected design rule error (for example, they are limited to those vias 22 that are to be deleted because these vias are distant by several 100 μm or less from the position of the selected design rule error). Then, those vias 22 present in such a range are deleted one by one sequentially. The present inventor has uniquely known from experience that in many cases the causal vias 22 for a selected design rule error exists near the selected design rule error, so that this unique knowledge of the present inventor is utilized in the second embodiment.

Figure 4:
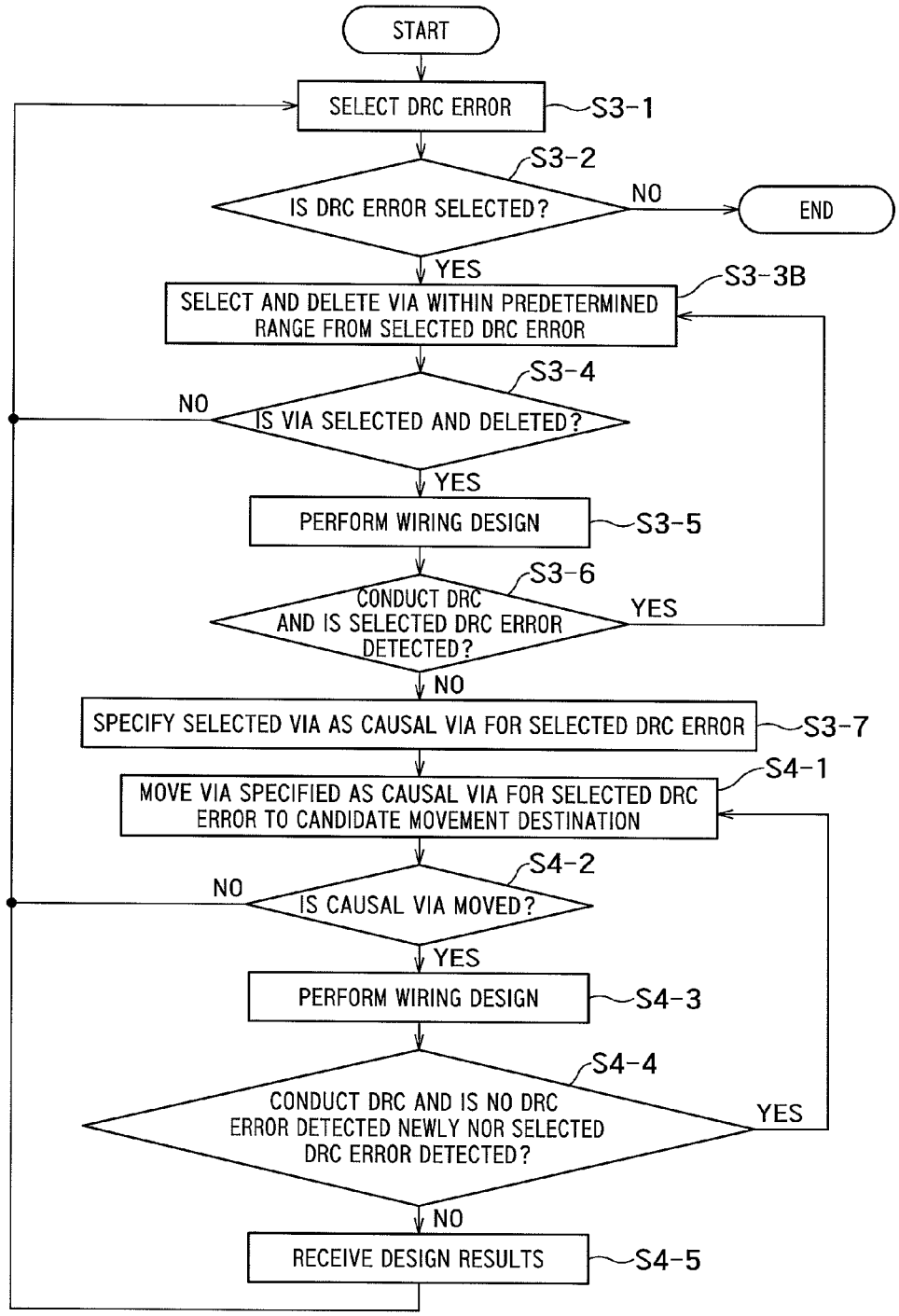
FIG. 4 is a flowchart showing the wiring design method according to a second embodiment.

In detail, the wiring design method in the second embodiment is the same as the first embodiment except that step 3-3 is replaced by step 3-3B. A flow of this design is shown as a flowchart of FIG. 4. A description will be given below only of step 3-3B, which is peculiar to the second embodiment.

(Step 3-3B) One of those vias 22 that are within a predetermined range from a selected design rule error selected at step S3-1 is selected as a selected via by using a via selection module 102. Then, the selected via is deleted using the via deletion module 103. Next, an advance is made to step 3-4.

(Third Embodiment)

A description will be given of a third embodiment. In the first embodiment, a causal via has been specified based on the presumption that one causal via 22 corresponds to one design rule error. However, actually, the one-to-one correspondence does not always hold true for the design rule errors and the causal vias; in some cases, one design rule error may be caused by a plurality of the vias 22. Such a situation is accommodated by the third embodiment.

Figure 5:
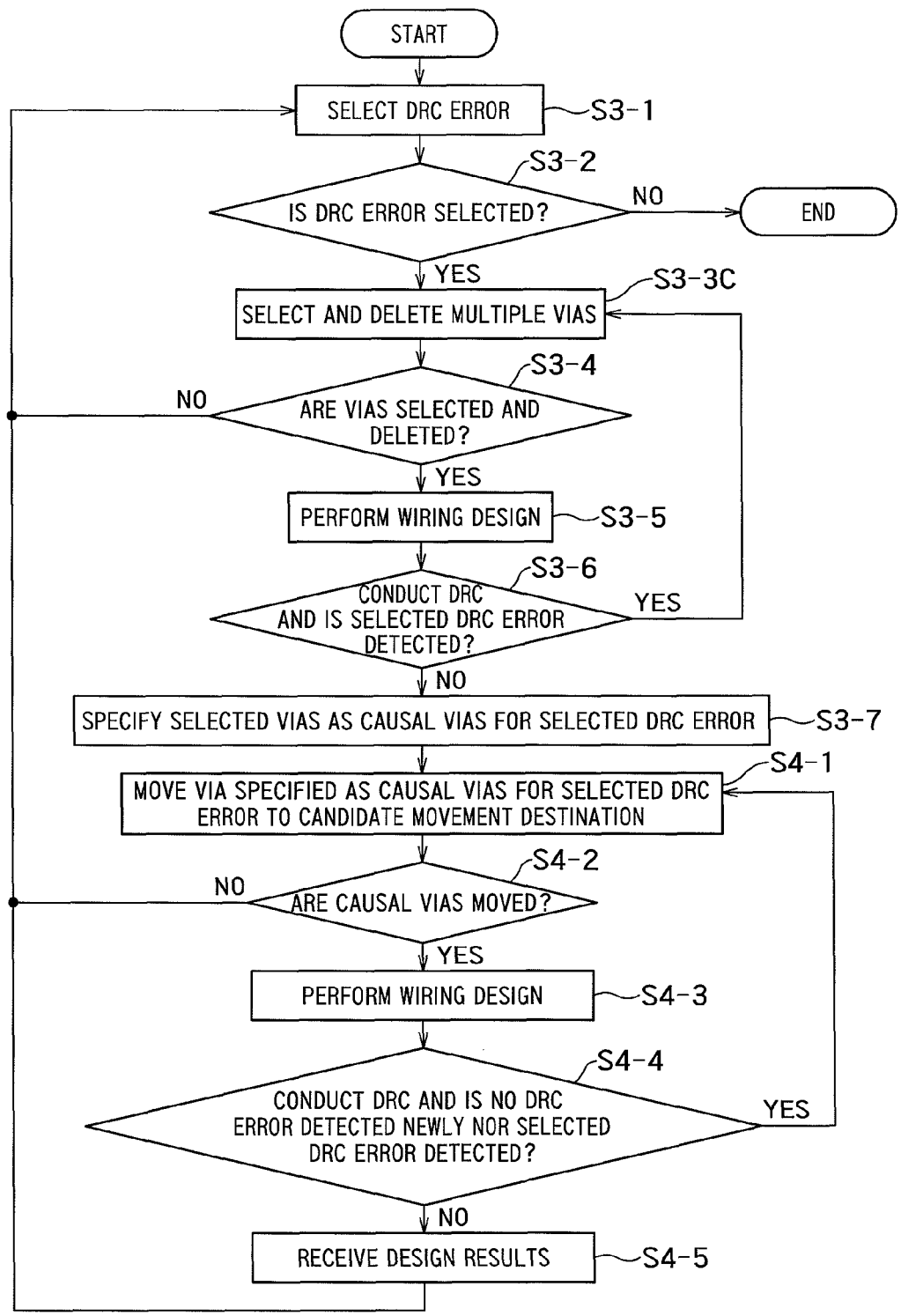
FIG. 5 is a flowchart showing the wiring design method according to a third embodiment.

The wiring design method in the third embodiment is the same as the first embodiment except that step 3-3 in the first embodiment is replaced by step 3-3C. A flow of this design is shown as a flowchart of FIG. 5. A detailed description will be given below only of step 3-3C, which is peculiar to the third embodiment.

(Step 3-3C) A predetermined number of vias 22 are selected from among those in a wiring board 28 as a plurality of selected vias by using a via selection module 102. (The predetermined number may be, for example, about two or three.) Further, the plurality of selected vias are deleted at a time by using a via deletion module 103. Next, an advance is made to step 3-4.

(Fourth Embodiment)

A description will be given of a fourth embodiment.

In the aforesaid embodiments, to specify the causal vias 22 for a selected design rule error, the vias 22 have been deleted sequentially and, in this condition, wiring design has been performed on connections 21a and 21b, while conducting design rule check until the selected design rule error is eliminated. However, even if the vias 22 in a wiring board 28 are all deleted one by one sequentially, the selected design rule error may not be eliminated in some cases. Even in such a case, wiring design is made possible in the fourth embodiment. More specifically, in the fourth embodiment, in a case where no causal vias can be specified in any of the preceding embodiments described above, one of the vias is selected as selected via and deleted, if the number of design rule errors detected in wiring design performed after selected vias are deleted is smaller than the number of the design rule errors detected at step 1 (first detected design rule error count), wiring design is permitted to go based on the presumption that the selected vias have caused the selected design rule error.

Figure 6:
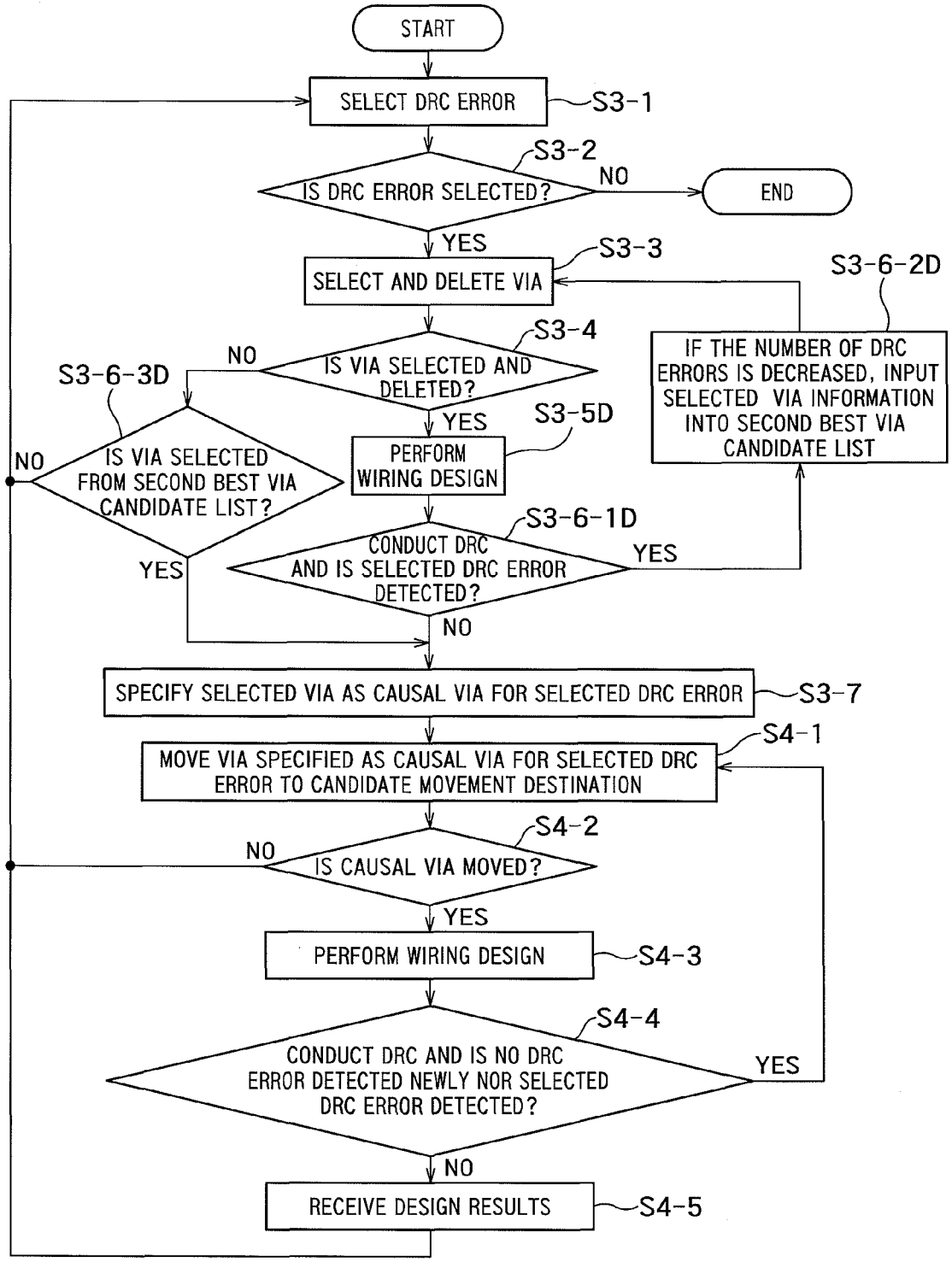
FIG. 6 is a flowchart showing the wiring design method according to a fourth embodiment.

In the fourth embodiment, the medium step of 3-6 in the first embodiment has been replaced by three minor steps of 3-6-1D through 3-6-3D. That is, the fourth embodiment is the same as the first embodiment except for steps 3-6-1D through 3-6-3D. A flow of the wiring design is shown as a flowchart of FIG. 6. A detailed description will be given below only of the steps which are peculiar to the fourth embodiment.

(Step 3-6-1D) Design rule check is conducted using a design rule check module 105 on the connections 21a and 21b designed at step 3-5.

As a result of design rule check thus conducted, if the selected design rule error selected at step 3-1 is eliminated (if no selected design rule error is detected), an advance is made to step 3-7.

On the other hand, if the selected design rule error is yet to be eliminated (if a selected design rule error is detected), an advance is made to step 3-6-2D.

(Step 3-6-2D) If the selected design rule error is yet to be eliminated but the number of the design rule errors detected at step 3-6-1D is smaller than that detected at step 1, the selected via is input into a second best candidate list. Then, a return is made to step 3-3.

On the other hand, if the number of the design rule errors is not smaller than that detected at step 1, a return is made to step 3-3 directly.

(Step 3-6-3D) If the selected design rule error is not eliminated, in other words, no causal via can be specified even by repeating the processing of steps 3-3 through 3-6-2D, finally, one selected via is selected from the second best via candidate list, to make an advance to step 3-7. (For example, if the second best via candidate list contains information of a plurality of selected vias, such a selected via is selected as to give the smallest number of design rule errors corresponding thereto in the second best candidate via list as compared to the number of the design rule errors detected at step 1.)

(Fifth Embodiment)

A description will be given of a fifth embodiment. According to the wiring design methods described above, even if the specified causal vias for a selected design rule error selected at step 2-1 have sequentially been moved to all of candidate movement destinations on a wiring board 28, the selected design rule error is still yet to be eliminated in some cases. Even in such a case, wiring design is made possible in the fifth embodiment.

More specifically, in the wiring design method according to the fifth embodiment, even in a case where a selected design rule error is yet to be eliminated, if the number of the design rule errors is smaller than the number (first detected design rule error count) of the design rule errors detected at step 1, positions of the causal vias and results of the wiring design at this time are input into a data storage unit 15 through a design result reception module 107. Then, finally, if the selected design rule error is not eliminated even by moving the causal vias to any position, one of the wiring design results is selected from the data storage unit 15 and output as a final wiring design result.

Figure 7:
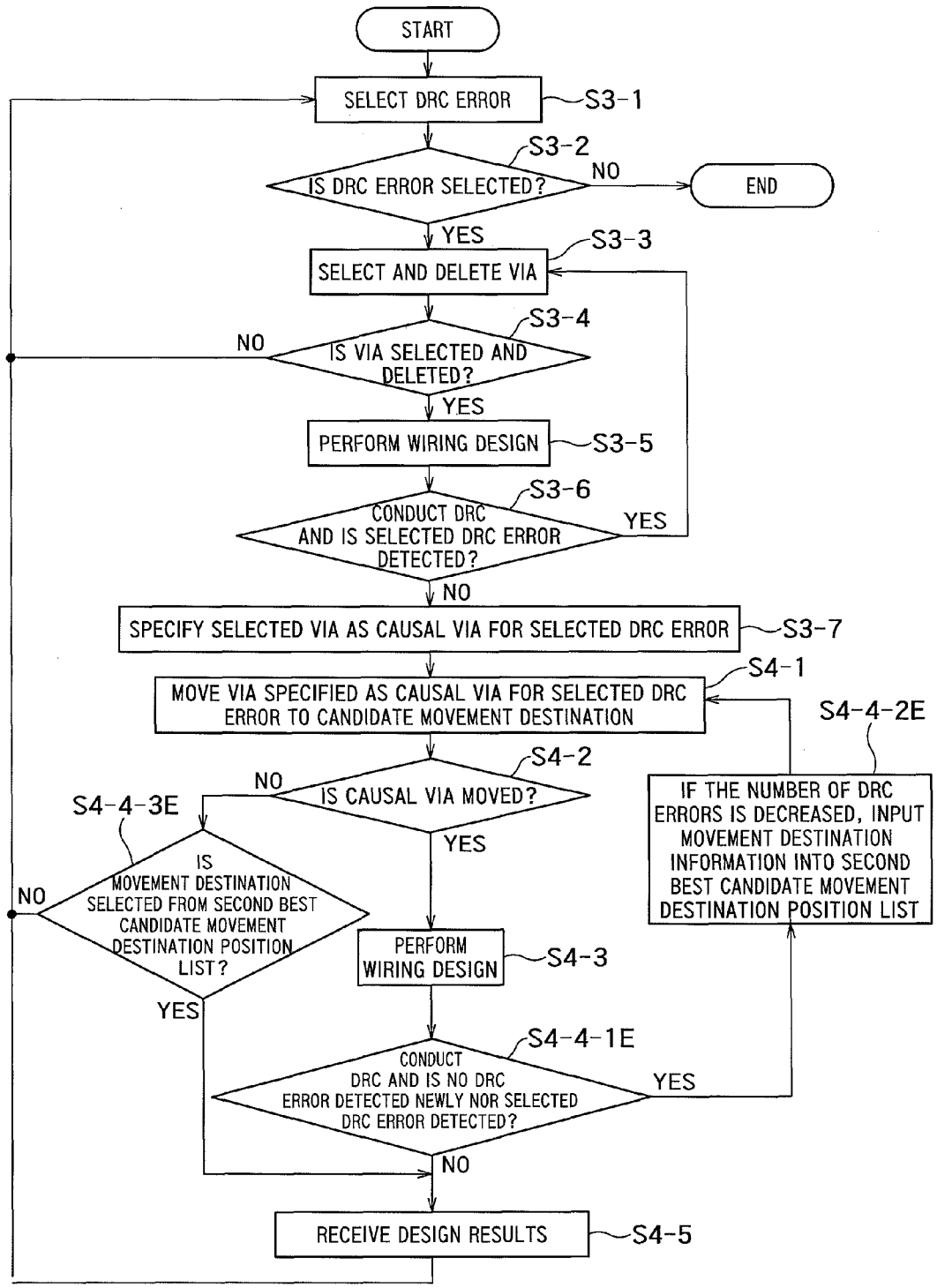
FIG. 7 is a flowchart showing the wiring design method according to a fifth embodiment.

In the fifth embodiment, the medium step of 4-4 in the second embodiment has been replaced by three minor steps of 4-4-1E, 4-4-2E, and 4-4-3E. That is, the fifth embodiment is the same as the first embodiment except for steps 4-4-1E through 4-4-3E. A flow of the design is shown as a flowchart of FIG. 7. A detailed description will be given below only of the steps 4-4-1E and 4-4-3E which are peculiar to the fifth embodiment.

(Step 4-4-1E) Design rule check is conducted using a design rule check module 105 on connections 21a and 21b designed at step 4-3.

If the selected design rule error is eliminated and no design rule error is detected newly, an advance is made to step 4-5.

On the other hand, if the selected design rule error is yet to be eliminated and/or a new design rule error is detected, an advance is made to step 4-4-2E.

(Step 4-4-2E) If the selected design rule error is yet to be eliminated but the number of the detected design rule errors is smaller than that detected at step 1, information of the candidate movement destinations is input into a second best candidate movement destination positions list, to make an advance to step 4-1.

On the other hand, if the number of the detected design rule errors is not smaller than that detected at step 1, a return is made to step 4-1 directly.

(Step 4-4-3E) If the selected design rule error is not eliminated finally even if by repeating processing of steps 4-1 through 4-4-2E, one candidate movement destination is selected from the second best candidate movement destination position list. (For example, if the second best candidate movement destination position list contains a plurality of possible candidate movement destination positions, such a candidate movement destination position is selected as to give the smallest number of design rule errors corresponding thereto as compared to the number of the design rule errors detected at step 1.) An advance is made to step 4-5.

Additional advantages and modifications will readily occur to those skilled in the art.

Therefore, the invention in its broader aspects is not limited to the specific details and representative embodiments shown and described herein.

Accordingly, various modifications may be made without departing from the spirit or scope of the general inventive concepts as defined by the appended claims and their equivalents.

The invention claimed is:

1. A wiring design method for a wiring board, the wiring board comprising first connection terminals and second connection terminals formed on a first surface of the wiring board, the first connection terminals and the second connection terminals being correlated with each other one-to-one, the method comprising:
    connecting the first connection terminals and the second connection terminals, respectively, on the first surface, by using wirings; and
    conducting design rule check for the second connection terminals and the wirings, by using an automatic wiring design apparatus;
    if at least one design rule error is found in an obtained result of the design rule check,
    selecting one design rule error from the obtained result of the design rule check as a selected design rule error;
    specifying a predetermined number of the second connection terminals as selected second connection terminals that correspond to the selected design rule error;
    moving the selected second connection terminals to predetermined coordinate positions on the first surface, respectively, to form several connecting patterns; and
    for each of connecting patterns,
        connecting the second connection terminals including the selected second connection terminals and the first connection terminals correlated with the second connection terminals including the selected second connection terminals, respectively, on the first surface, by using wirings;
        conducting design rule check for the second connection terminals and the wirings; and
        determining whether neither design rule errors are detected newly nor the selected design rule error is detected.

2. The wiring design method for the wiring board according to claim 1, wherein one of the second connection terminals is specified as the selected second connection terminal that corresponds to the selected design rule error.

3. The wiring design method for the wiring board according to claim 1, wherein the followings are repeated until neither design rule errors are detected newly nor the selected design rule error is detected, for all of the connecting patterns:
    connecting the second connection terminals including the selected second connection terminals and the first connection terminals correlated with the second connection terminals including the selected second connection terminals, respectively, on the first surface, by using wirings;

conducting the design rule check for the second connection terminals and the wirings; and determining whether neither design rule errors are detected newly nor the selected design rule error is detected.

4. The wiring design method for the wiring board according to claim 1, wherein specifying the predetermined number of the selected second connection terminals comprising:

selecting a predetermined number of the second connection terminals from the second connection terminals as tentative selected second connection terminals;

deleting the tentative selected second connection terminals;

connecting remaining second connection terminals and the first connection terminals correlated with the remaining second connection terminals, respectively, on the first surface, by using wirings;

conducting the design rule check for the second connection terminals and the wirings; and determining whether the selected design rule error is detected, to confirm that the selected design rule error is not detected.

5. The wiring design method for the wiring board according to claim 4, comprising:

selecting a predetermined number of tentative selected second connection terminals from the second connection terminals, the tentative selected second connection terminals being within a predetermined distance from the selected design rule error.

6. The wiring design method for the wiring board according to claim 5, wherein the followings are repeated until the selected design rule error is not detected, for all of the second connection terminals:

selecting a predetermined number of the second connection terminals from the second connecting terminals as tentative selected second connection terminals;

deleting the tentative selected second connection terminals;

connecting remaining second connection terminals and the first connection terminals correlated with the remaining second connection terminals, respectively, on the first surface, by using wirings;

conducting the design rule check for the second connection terminals and the wirings; and determining whether the selected design rule error is detected.

7. The wiring design method for the wiring board according to claim 1, wherein in the wiring board, the first connection terminals are semiconductor chip connection terminals that are configured to be able to connected with chip connection terminals on a semiconductor chip to be mounted on the first surface; and, the second connection terminals are configured to be able to electrically connect the first surface side of the wiring board and a second surface side of the wiring board, the second surface side being a back side of the first surface side.

8. The wiring design method for the wiring board according to claim 7, wherein in the wiring board, the second surface is mounted thereon with external device connection terminals that are configured to able to be connected with external terminals of an external device to which the wiring board is to be connected.

9. The wiring design method for the wiring board according to claim 8, wherein in the wiring board, the second connection terminals are connected with the external device connection terminals corresponding thereto respectively on the second surface.

10. The wiring design method for the wiring board according to claim 9, wherein in the wiring board, the second connection terminals are constituted as vias configured to pass through from the first surface of the wiring board to the second surface of the wiring board.

11. The wiring design method for the wiring board according to claim 10, wherein connecting the second connection terminals including the selected second connection terminal and the first connection terminals correlated with the second connection terminals including the selected second connection terminal, respectively, on the first surface, comprising:

connecting the second connection terminals including the selected second connection terminal and the external device connection terminals correlated with the second connection terminals including the selected second connection terminal, respectively, on the second surface.

12. The wiring design method for the wiring board according to claim 10, wherein specifying the selected second connection terminal comprising:

selecting a predetermined number of the second connection terminals from the second connection terminals as tentative selected second connection terminals;

deleting the tentative selected second connection terminals;

connecting remaining second connection terminals and the first connection terminals correlated with the remaining second connection terminals, respectively, on the first surface, by using wirings;

conducting the design rule check for the remaining second connection terminals and the wirings; and determining whether the selected design rule error is detected, to confirm that the selected design rule error is not detected.

13. The wiring design method for the wiring board according to claim 12, wherein connecting the remaining second connection terminals and the first connection terminals correlated with the remaining second connection terminals, respectively, on the first surface, comprising:

connecting remaining vias and the external device connection terminals correlated with the remaining vias, respectively, on the second surface.

14. A wiring design method for a wiring board, the wiring board comprising: semiconductor chip connection terminals formed on a first surface of the wiring board and configured to able to be connected with connection terminals formed on a semiconductor chip to be mounted on the first surface; external device connection terminals formed on a second surface facing the first surface of the wiring board and being able to be connected with connection terminals of an external device to which the wiring board is to be connected; and, vias configured to pass through from the first surface of the wiring board to the second surface of the wiring board, each of vias being correlated with the semiconductor chip connection terminals one-to-one on the first surface and correlated with the external device connection terminals one-to-one on the second surface, the method comprising:

connecting the semiconductor chip connection terminals and the vias correlated with the semiconductor chip connection terminals one-to-one, respectively, on the first surface, by using first wirings;

connecting the external device connection terminals and the vias correlated with the external device connection terminals one-to-one, respectively, on the second surface, by using second wirings; and conducting design rule check for the first and second wirings, and the vias, by using an automatic wiring design apparatus, if at least one design rule error is found in an obtained result of the design rule check, defining the number of the design rule errors thus detected as a first detected design rule error count;

selecting the one design rule error from the obtained result of the design rule check as a selected design rule error;

selecting one of the vias formed in the wiring board as a selected via;

deleting the selected via temporarily;

connecting remaining vias and the semiconductor chip connection terminals correlated with the remaining vias, respectively, on the first surface, by using first wirings, and connecting remaining vias and the external device connection terminals correlated with the remaining vias, respectively, on the second surface, by using second wirings;

conducting the design rule check for the first and second wirings, and the remaining vias;

determining whether the number of the detected design rule errors is smaller than the first detected design rule error count;

if the number of the detected design rule errors is smaller than the first detected design rule error count, undeleting the deleted selected via, and moving the selected via to predetermined coordinate positions on the first surface, respectively, to form several connecting patterns; and for each of the connecting patterns, connecting the vias including the selected via and the semiconductor chip connection terminals correlated with the vias including the selected via, respectively, on the first surface, by using first wirings and connecting the vias including the selected via and the external device connection terminals correlated with the vias including the selected via, respectively, on the second surface, by using second wirings;

conducting the design rule check for the first and second wirings, and the vias; and determining whether neither design rule errors are detected newly nor the selected design rule error is detected.

15. The wiring design method for the wiring board according to claim 14, wherein the followings are repeated until neither design rule errors are detected newly nor the selected design rule error is detected:

connecting the vias including the selected via and the semiconductor chip connection terminals correlated with the vias including the selected via, respectively, on the first surface, by using first wirings, and connecting the vias including the selected via and the external device connection terminals correlated with the vias including the selected via, respectively, on the second surface, by using second wirings;

conducting the design rule check for the first and second wirings, and the vias; and determining whether neither design rule errors are detected newly nor the selected design rule error is detected.

16. The wiring design method according to claim 14, further comprising:

repeating the followings for all of the vias formed in the wiring board:

selecting one of all of the vias formed in the wiring board as a selected via;

deleting the selected via;

connecting remaining vias and the semiconductor chip connection terminals correlated with the remaining vias, respectively, on the first surface, by using first wirings, and connecting the vias and the external device connection terminals correlated with the remaining vias, respectively, on the second surface, by using second wirings;

conducting the design rule check for the first and second wirings, and the remaining vias;

determining whether the number of the detected design rule errors is smaller than the first detected design rule error count; and undeleting and moving such a selected via to the predetermined coordinate positions on the first surface, the such a selected via is a via which give the smallest number of design rule errors as compared to the first detected design rule error count.

17. A wiring design method for a wiring board, the wiring board comprising: semiconductor chip connection terminals formed on a first surface of the wiring board and configured to able to be connected with connection terminals formed on a semiconductor chip to be mounted on the first surface; external device connection terminals formed on a second surface facing the first surface of the wiring board and configured to able to be connected with connection terminals of an external device to which the wiring board is to be connected; and vias configured to pass through from the first surface of the wiring board to the second surface of the wiring board, each of the vias being correlated with each of the semiconductor chip connection terminals one-to-one on the first surface and correlated with each of the external device connection terminals one-to-one on the second surface, the method comprising:

connecting the semiconductor connection terminals and the vias correlated with the semiconductor chip connection terminals one-to-one, respectively, on the first surface, by using first wirings;

connecting the external device connection terminals and the vias correlated with the semiconductor chip connection terminals one-to-one, respectively, on the second surface, by using second wirings; and conducting design rule check for the first and second wirings, and the vias, by using an automatic wiring design apparatus, if at least one design rule error is found in an obtained result of the design rule check, defining the number of the design rule errors thus detected as a first detected design rule error count;

selecting the one design rule error from the obtained result of the design rule check as a selected design rule error;

selecting one of the vias formed in the wiring board as a selected via;

deleting the selected via temporarily;

connecting remaining vias and the semiconductor chip connection terminals correlated with the remaining vias, respectively, on the first surface, by using first wirings, and connecting the remaining vias and the external device connection terminals correlated with the remaining vias, respectively, on the second surface, by using second wirings;

conducting the design rule check for the first and second wirings, and the remaining vias;

determining whether the selected design rule error is detected;

if the selected design rule error is not detected, undeleting the deleted selected via, and moving the selected via to predetermined coordinate positions on the first surface, respectively, to form several connecting patterns; and for each connecting patterns, connecting the vias including the selected via and the semiconductor chip connection terminals correlated with the vias including the selected via, respectively, on the first surface, by using first wirings, and connecting the vias including the selected via and the external device connection terminals correlated with the vias including the selected via, respectively, on the second surface, by using second wirings;

conducting the design rule check for the first and second wirings, and the vias; and determining whether the number of the detected design rule errors is smaller than the first detected design rule error count.

18. The wiring design method for the wiring board according to claim 17, wherein the followings are repeated until the selected design rule error is not detected:

selecting one of the vias formed in the wiring board as a selected via;

deleting the selected via;

connecting remaining vias and the semiconductor chip connection terminals correlated with the remaining vias, respectively, on the first surface, by using first wirings, and connecting the vias and the external device connection terminals correlated with the remaining vias, respectively, on the second surface, by using second wirings;

conducting the design rule check for the first and second wirings, and the vias; and determining whether the selected design rule error is detected.

19. The wiring design method according to claim 17, wherein the followings are repeated for all of the predetermined coordinate positions:

moving the selected via to the coordinate positions, respectively, to form several connecting patterns; and for each of the connecting patterns, connecting the vias including the selected via and the semiconductor chip connection terminals correlated with the vias including the selected via, respectively, on the first surface, by using first wirings, and connecting the vias including the selected via and the external device connection terminals correlated with the vias including the selected via, respectively, on the second surface, by using second wirings;

conducting the design rule check for the first and second wirings, and the vias; and determining whether the number of the detected design rule errors is smaller than the first detected design rule error count, and moving the selected via to one such of the predetermined coordinate positions, the such of the predetermined coordinate positions is a position which give the smallest number of design rule errors as compared to the first detected design rule error count.

* * * * *